United States Patent [19]
Kunihisa et al.

[11] Patent Number: 5,319,318
[45] Date of Patent: Jun. 7, 1994

[54] GAIN CONTROL CIRCUIT AND SEMICONDUCTOR DEVICE

[75] Inventors: Taketo Kunihisa, Neyagawa; Yukio Sakai, Sakai; Kazuhiro Yahata; Tadayoshi Nakatsuka, both of Osaka; Hideki Yagita, Hirakata, all of Japan

[73] Assignee: Matsushita Electric Industrial Co., Ltd., Osaka, Japan

[21] Appl. No.: 931,711

[22] Filed: Aug. 18, 1992

[30] Foreign Application Priority Data

Aug. 19, 1991 [JP] Japan ............................ 3-206889

[51] Int. Cl.[5] .............................................. H03G 3/12
[52] U.S. Cl. ..................................... 330/282; 330/283; 330/277
[58] Field of Search .................. 330/283, 282, 277, 86

[56] References Cited

U.S. PATENT DOCUMENTS

| | | | |
|---|---|---|---|
| 3,968,452 | 7/1976 | Sahara et al. | 330/283 |
| 4,929,912 | 5/1990 | Blanken | 330/288 |
| 4,983,929 | 1/1991 | Real et al. | 330/277 |
| 5,010,304 | 4/1991 | Mueller et al. | 330/277 |
| 5,015,968 | 5/1991 | Podell et al. | 330/277 |
| 5,021,743 | 6/1991 | Chu et al. | 330/54 |
| 5,025,226 | 6/1991 | Taylor | 330/277 |
| 5,051,705 | 9/1991 | Moghe et al. | 330/282 |
| 5,072,199 | 12/1991 | Furlow | 330/277 |
| 5,208,547 | 5/1993 | Schindler | 330/277 |
| 5,237,289 | 8/1993 | Han | 330/277 |

FOREIGN PATENT DOCUMENTS

| | | | |
|---|---|---|---|
| 61-234107 | 10/1986 | Japan | 330/282 |
| 63-185211 | 7/1988 | Japan | 330/282 |
| 2308607 | 12/1990 | Japan | 330/282 |

OTHER PUBLICATIONS

A. Yamamoto et al., "A Compact Satellite 1 GHz Tuner with GaAs IC", IEEE Transaction on Consumer Electronics, vol. 35, Aug. 1989 pp. 397–405.

*Primary Examiner*—Raymond A. Nelli
*Attorney, Agent, or Firm*—Ratner & Prestia

[57] ABSTRACT

A gain control circuit includes a first FET for serving as an active load, a second FET serving as an amplifier, and a third FET for serving as a current source. The first, second, and third FETs have substantially the same characteristics and are mutually connected in a series. The gain control circuit further includes a fourth FET for serving as a variable active load connected in parallel with the third FET and a capacitor connected between the third and fourth FETs. The fourth FET is also connected to a gain control terminal. The gain of the second FET is controlled by the voltage applied to the gate of the fourth FET through said gain control line.

7 Claims, 12 Drawing Sheets

GAIN CONTROL CIRCUIT AND SEMICONDUCTOR DEVICE

BACKGROUND OF THE INVENTION

1. Field of the Invention

The present invention relates to a gain control circuit using a metal semiconductor field-effect transistor (MESFET) device of gallium arsenide (GaAs) that bay be used in television tuners. The present invention also relates to a semiconductor device.

2. Description of the Prior Art

Gain control circuits conventionally used in television tuners generally control the gain using a device combining P-I-N diode attenuator and fixed gain amplifier, or by changing the operating point of a dual gate FET device. Cost effective commercial application of P-I-N diodes is impeded, however, by the difficulties of manufacturing a P-I-N structure with stable characteristics from GaAs. When a gain control circuit using dual gate FET devices is used, the drain current (hereinafter referred to as "$I_{DS}$") varies with the change in the operating point. This necessitates, as described in IEEE Transactions on Consumer Electronics (Vol. 35, No. 3, August 1989), a separate circuit to stabilize the DC bias and to stabilize the variation in current consumption of the overall gain control circuit due to the gain control voltage. IEEE is an abbreviation for Institute of Electrical and Electronics Engineers, Inc.

In a semiconductor device integrating devices such as GaAs MESFET devices with high $I_{DS}$ variation to form a gain control circuit, the DC bias of the drain will fluctuate as the voltage drop changes with the variation in $I_{DS}$ if a resistance load is used between the power supply and drain of the source ground amplifier. Furthermore, while the drain load resistance must be increased to obtain a sufficient gain, this also produces a larger change in the DC bias of the drain. As a result, a drain-source voltage (hereinafter referred to as "$V_{DS}$") sufficient to assure operation of the FET in the saturation range is set in the conventional semiconductor device when the power supply voltage is low, and it is difficult to simultaneously obtain sufficient gain and a stable DC bias.

In addition, a gain control circuit with a circuit construction which does not require a special power supply to set the gain control voltage and does not require a power supply providing a negative voltage is desirable for general purpose applicability. This type of circuit construction requires that the voltage range needed to obtain both the maximum and minimum gain levels be within the power supply voltage to ground voltage range of the gain control circuit, a requirement which cannot be met with the conventional gain control circuit construction.

SUMMARY OF THE INVENTION

The object of the present invention is therefore to provide a gain control circuit which solves these problems.

The present invention has been developed with a view to substantially solving the above described disadvantages and has for its essential object to provide an improved gain control circuit.

In order to achieve the aforementioned objective, a gain control circuit comprises a first FET for serving as an active load connected to a power supply line; a second FET, connected to a gain control line, for serving as an amplifier arranged in a series connection with the first FET; a third FET for serving as a current source arranged in a series connection with said second FET; a fourth FET for serving as a variable active load arranged in a parallel connection with the third FET and in connection with a gain control line; and a capacitor connected between the third and fourth FETs, whereby the gain of the second FET is controlled by the voltage applied to the gate of the fourth gate through the gain control line.

BRIEF DESCRIPTION OF THE DRAWINGS

These and other objects and features of the present invention will become clear from the following description taken in conjunction with the preferred embodiments thereof with reference to the accompanying drawings throughout which like parts are designated by like reference numerals, and in which.

DETAILED DESCRIPTION OF THE PREFERRED EMBODIMENTS

Figure 1:
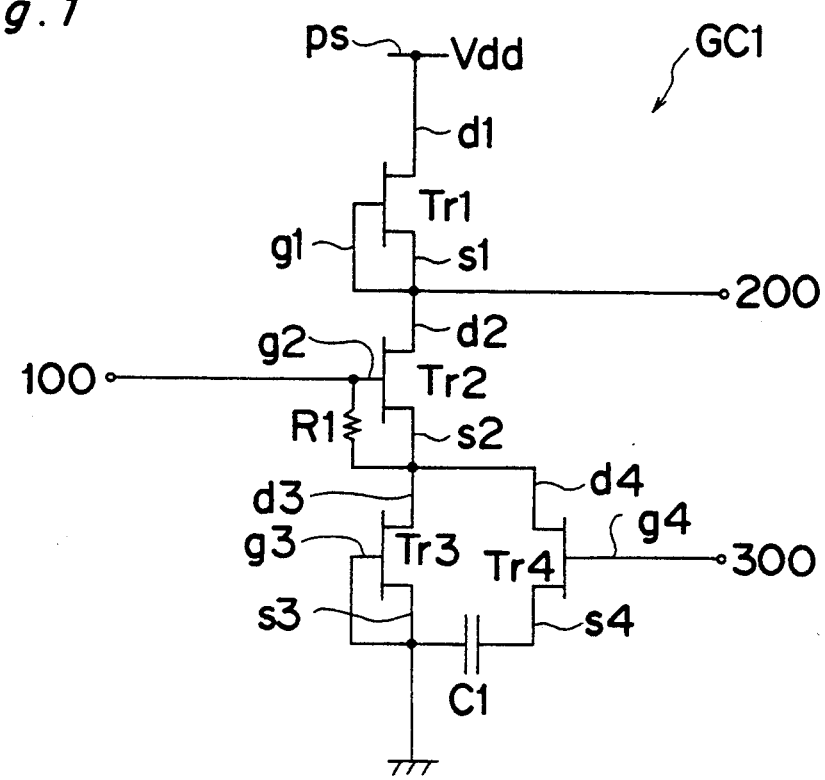
FIG. 1 is a circuit diagram of a gain control circuit according to a first embodiment of the invention.

Referring to FIG. 1, a gain control circuit according to a first embodiment of the present invention is shown. The gain control circuit GC1 comprises four field effect transistors (hereinafter referred to as "FET"). The first FET Tr1 is used as an active load, the second FET Tr2 is used as an amplifier, the third FET Tr3 as a rated current source, and the fourth FET Tr4 as a variable active load. It is important to note that the first, second, and third FETs, Tr1, Tr2, and Tr3 have substantially the same characteristics.

The gain control circuit GC1 further comprises a bias-setting damping resistor R1, a high frequency ground capacitor C1, an input terminal 100, an output terminal 200, a gain control terminal 300, and a power supply line ps.

In the gain control circuit GC1, the first FET Tr1 has a drain line d1 connected to the power source line ps and source and gate lines s1 and g1 connected to a drain line d2 of the second FET Tr1. The bias-setting damping resistor R1 is connected between gate and source lines s2 and g2 of the second FET Tr2. The source line s2 of the second FET Tr2 is connected to the drain lines d3 and d4 of the third FET Tr3 and fourth FET Tr4. A gate line g3 and source lines s3 of the third FET Tr3 are grounded. The high frequency ground capacitor C1 is connected between a source line s4 of the fourth FET Tr4 and the ground.

The gate and drain lines g2 and d2 of the second FET Tr2 are connected to the input and output lines 100 and 200, respectively, and the gate line g4 of the fourth FET Tr4 is connected to the gain control terminal 300. The gain of the second FET Tr2, which serves as an amplifier, is changed by varying the voltage impressed to the gain control terminal 300.

The operation of the gain control circuit GC1 differs between the DC bias component and the RF component.

First, the operation of the circuit GC1 with respect to the DC bias is described. The resistance of the bias-setting damping resistor R1 is set within the range of some hundreds ohms to some kilo ohms so that the voltage drop of the bias-setting damping resistor R1 caused by the gate leakage current of the second FET Tr2 is sufficiently low. The maximum saturation drain current (hereinafter referred to as "$I_{DSS}$") of the third FET Tr3 through line d3 is set to approximately one hundred times the current flowing through line d4. As a result, the circuit is self-biased such that the same $I_{DSS}$ of the third FET Tr3 flows to the first and second FETs Tr1 and Tr2. Also, the drain-source voltage (hereinafter referred to as "$V_{DS}$") is equal in these three FETs Tr1, Tr2, and Tr3, and the gate-source voltage (hereinafter referred to as "$V_{GS}$") is also equal in these three FETs Tr1, Tr2, and Tr3. As a result, the voltage of the output terminal 200 is two-thirds ($\frac{2}{3}$) of the power supply voltage $V_{dd}$ (hereinafter referred to as "$V_{dd}$"), and the source voltage of the second FET Tr2 is one-third ($\frac{1}{3}$) of the $V_{dd}$ regardless of the value of $I_{DSS}$.

Next, the operation of the gain control circuit GC1 with respect to the high frequency (RF) characteristics is described. The total impedance Zt between the ground and the source line s2 of the second FET Tr2, which is a source commoned amplifier, is determined by the drain input impedance Z3 of the third FET Tr3, the drain input impedance Z4 of the fourth FET Tr4 drain input impedance, and the impedance Zc of the capacitor C1, and is obtained as follows:

$$Zt = Z3 \times (Z4 + Zc)/(Z3 + Z4 + Zc).$$

If, for example, the gate length lg=1 μm, gate width wg=250 μm, and the threshold voltage Vth=0.4 V, the third FET Tr3 drain input impedance will be high, approximately 700 Ω. Relative to this, the high frequency ground capacitor C1 has a low impedance, e.g., 1 Ω for a 100 pF with respect to a 1 GHz signal. As a result, the total impedance Zt is mostly controlled by the drain input impedance Z4 of the fourth FET Tr4.

The fourth FET Tr4 drain input impedance is obtained when $V_{DS}=0$ V, but is varied by the gate-drain voltage (hereinafter referred to as "$V_{CD}$") thereof. For example, if the gate length lg=1 μm, gate width wg=400 μm, and the threshold voltage Vth=0.4 V, the fourth FET Tr4 drain input impedance may vary between 250 Ω to 20 Ω with respect to the $V_{GD}$ range −0.4 V to 0 V. As a result, the impedance of the third FET Tr3, serving as a bypass, can be changed by controlling the fourth FET Tr4 gate voltage, and thus, the gain of FET Tr2 serving as amplifier can be controlled.

The impedance of the first FET Tr1, which serves an active load, is high (approximately 700 Ω) because the same signal is input to both the source and gate lines s1 and g1. In other words, the load connected to the drain of the second FET Tr2, i.e., the amplifier, is high, and sufficient gain can therefore be obtained. When this load is substituted by a resistance load, a voltage drop of 7 V occurs when $I_{DSS}$ is 10 mA, but by using the first FET Tr1 as an active load, the potential difference can be limited to approximately 1.6 V. Variations in the DC bias can thus be prevented.

Figure 19:
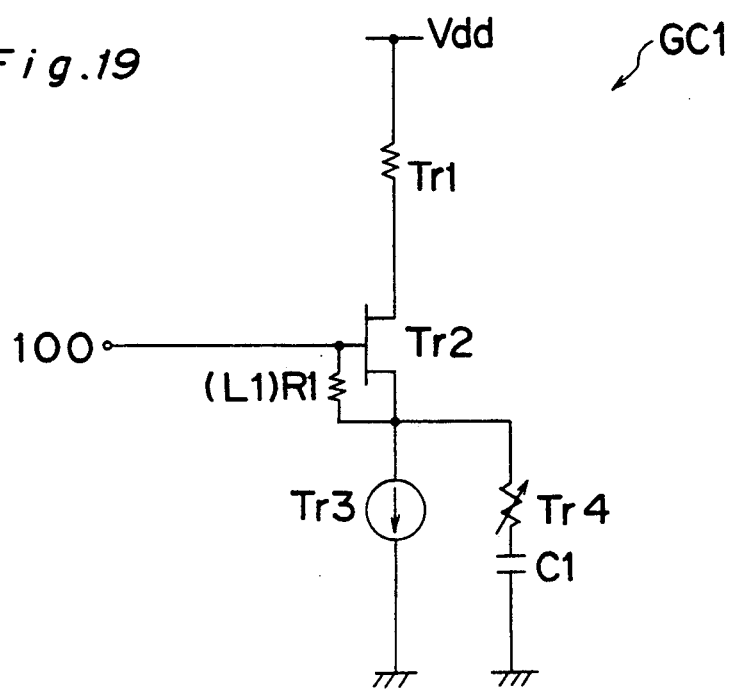
FIG. 19 is an equivalent circuit diagram of the gain control circuit shown in FIG. 1.

Referring to FIG. 19, an equivalent circuit of the gain control circuit GC1 with respect to AC signal is shown. It is to be noted that the bias-setting damping resistor R1 can be substituted by an inductor L1 which can cut the high frequency component.

Figure 7:
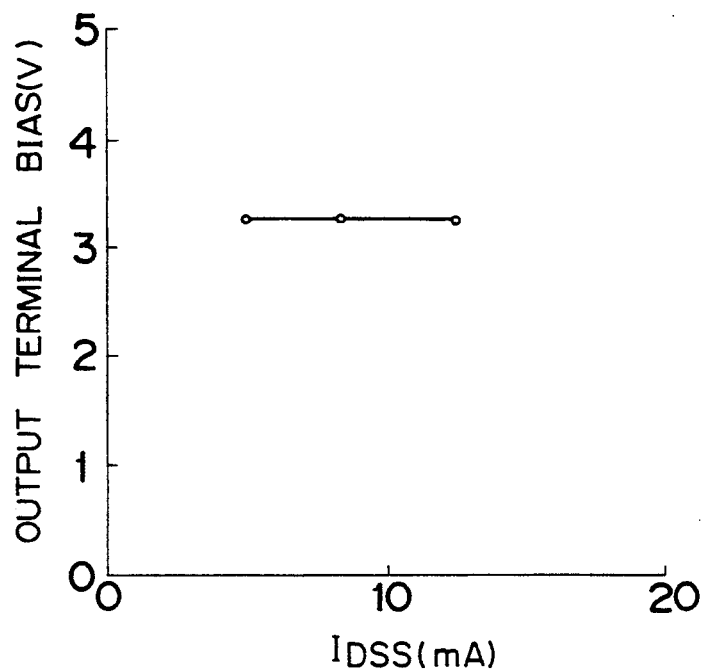
FIG. 7 is a graph of the maximum saturation drain current dependency of the output terminal bias in the gain control circuit shown in FIG. 1.
Figure 8:
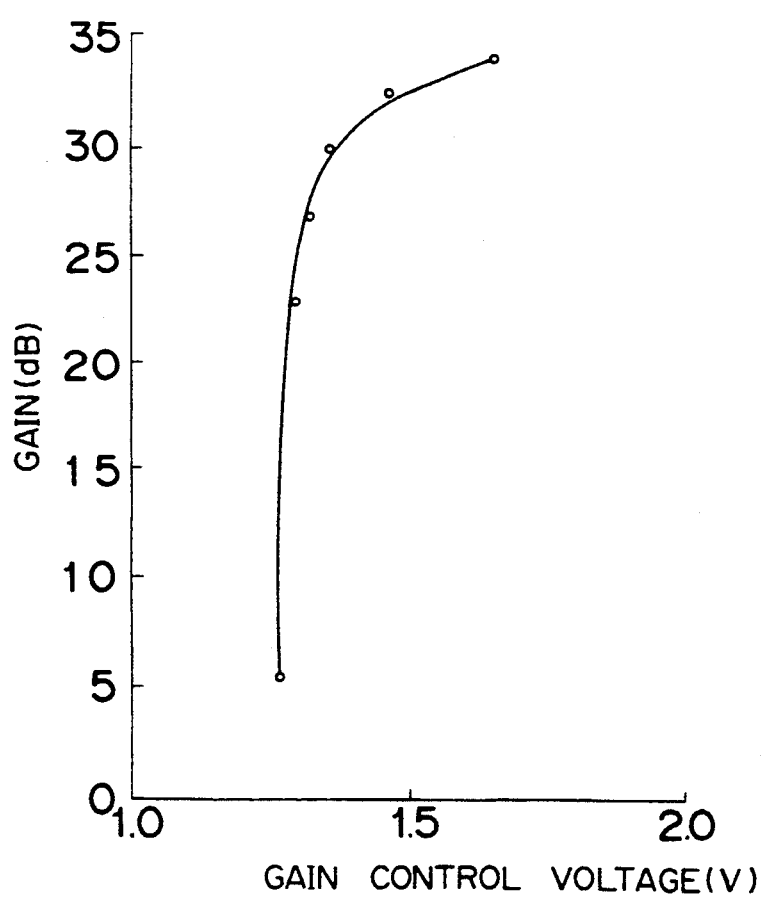
FIG. 8 is a graph of the gain control voltage dependency of the gain in the gain control circuit shown in FIG. 1.

Referring to FIGS. 7 and 8, the maximum saturation drain current dependency of the output terminal bias and the gain control voltage dependency of the gain in the gain control circuit GC1 are described below. The characteristics represented in these figures are obtained from the experiments. The experiments are executed under the conditions that the $V_{dd}$ is 5 V, the voltage applied to the gain control terminal 300, i.e., the gain control voltage, is from 1.0–1.6 V, the gate width wg of each of the first, second, and third FETs Tr1, Tr2, and Tr3 is 250 μm, the gate width wg of the fourth FET Tr4 is 400 μm, the bias-setting damping resistance R1 is 1 kΩ, the high frequency ground capacitance C1 is 1000 pF, and the used frequency is 100 MHz.

As shown in FIG. 7, a stable bias level is observed at 3.3 V throughout the maximum saturation drain current $I_{DSS}$ from 4.9 to 12.5 mA, provided that the gain control voltage is 1.5 V.

As shown in FIG. 8, with the circuit GC1 of FIG. 1 it is possible to control the gain from +34 dB to +5 dB with respect to the gain control voltage from 1.0 V to 1.6 V. In other words, the variation from the voltage for obtaining the maximum gain to the voltage for obtaining the minimum gain is between the power supply voltage and the ground voltage of the gain control circuit. Thus, it is not necessary to provide a separate power supply for controlling the gain. It is to be noted that the maximum saturation drain current $I_{DSS}$ obtained in the above case is 8.3 mA.

Figure 2:
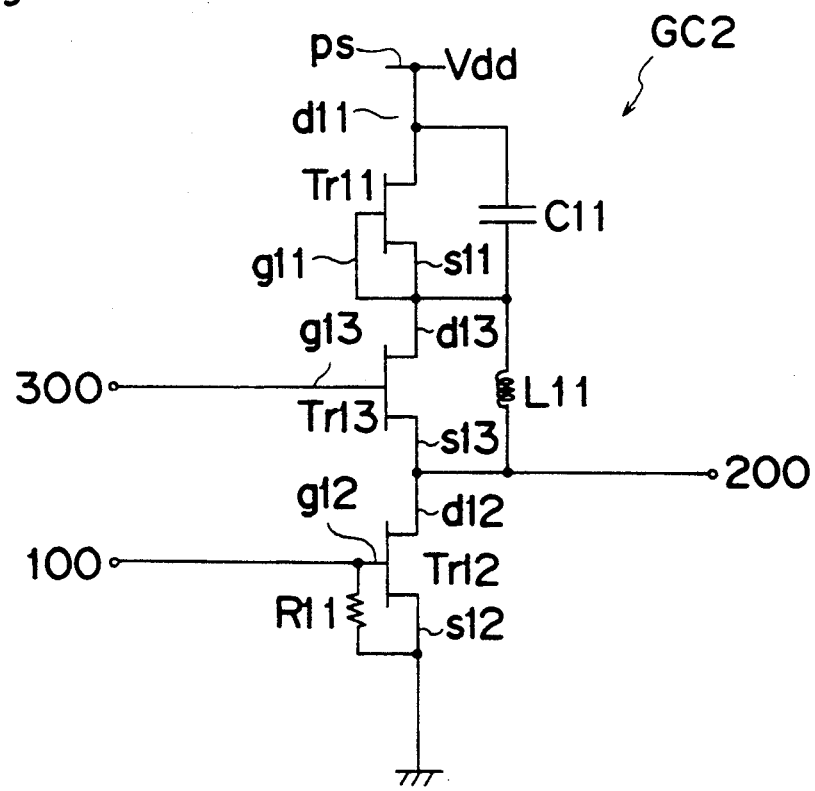
FIG. 2 is a circuit diagram of a gain control circuit according to a second embodiment of the invention.

Referring to FIG. 2, a gain control circuit according to a second embodiment of the present invention is described. The gain control circuit GC2 comprises a first FET Tr11 serving as an active load, a second FET Tr12 serving as an amplifier, and a third FET Tr13 serving as a variable active load. The first and second FETs, Tr11 and Tr12 have substantially the same characteristics. The gain control circuit GC2 further comprises a bias-setting damping resistor R11, a choke coil L11, a high frequency ground capacitor C11, an input terminal 100, an output terminal 200, a gain control terminal 300, and a power supply line ps.

In the gain control circuit GC2, a drain line d11 of the first FET Tr11 is connected to the power supply line ps, and source and gate lines s11 and g11 are connected each other. The capacitor C11 is connected between the power supply line ps and the source line s11 of the first FET Tr11. a source line s13 of the third FET Tr13 is connected to a drain line d12 of the second FET Tr12. The choke coil L11 is connected between the train and source lines d13 and s13 of the third FET Tr13.

The bias-setting damping resistor R11 is connected between a gate line g12 of the second FET Tr12 and the ground, and a source line s12 of the second FET Tr12 is grounded.

The gate line g12 and drain line d12 of the second FET Tr12 are connected to the input terminal 100 and output 200 terminal, respectively, and the gate line g13 of the third FET Tr13 is connected to the gain control terminal 300. The gain of the second FET Tr12, which serves as an amplifier, is changed by varying the voltage applied to the gain control terminal 300.

First, the operation of the circuit GC2 with respect to the DC bias is described below. The resistance of the bias-setting damping resistor R11 is set within the range of some hundreds ohms to some Kilo ohms so that the voltage drop caused by the gate leakage current of the second FET Tr12 at the bias-setting damping resistor R11 is sufficiently low. The $I_{DSS}$ of the second FET Tr12 through line d12 is set to approximately one hundred times the current flowing through the line g13. As a result, the circuit GC2 is self-biased such that the $I_{DSS}$ of the second FET Tr12 flows to the first FET Tr11, the $V_{DS}$ is equal in the first and second FETs Tr11 and Tr12, and the $V_{GS}$ is also equal in these two FETs Tr11 and Tr12. Thus, the voltage of the output terminal 200 is one-half (½) of the $V_{dd}$ regardless of the value of $I_{DSS}$.

Next, the operation of the gain control circuit GC2 with respect to the RF characteristics is described below. The total impedance Zt between the power supply line ps and the drain line d12 is determined by the source input impedance Z13, and the impedance Zl of the choke coil L11, the source input impedance Z11 of the first FET Tr11, and the impedance Zc of the capacitor C11, and is obtained as follows:

$$Zt = Z11 \times Zc/(Z11 + Zc) + Z13 \times Zl/Z13 + Zl.$$

It is noted that the second FET Tr12 and the power supply ps serve as a source-grounded amplifier and a high frequency ground, respectively. The source input impedance of the first FET Tr11 is high because the same signal is input to the source and gate lines s11 and g11 of the first FET Tr11.

If, for example, the gate length lg = 1 μm, gate width wg = 250 μm, and the threshold voltage Vth = 0.4 V, the source input impedance of the first FET Tr11 will be approximately 700 Ω. In addition, if the capacitance of the high frequency ground capacitor C11 with respect to a 1 GHz signal is 100 pF, the impedance will be a low 10 Ω. As a result, the total impedance Zt will be less than 10 Ω. If the inductance of the choke coil L11 with respect to a 1 GHz signal is 1 μH, the total impedance Zt will be 1 kΩ. As a result, the total impedance Zt is mostly controlled by the source input impedance Z13 of the third FET Tr13.

The third FET Tr13 source input impedance is obtained when $V_{DS}$ is 0 V, but varies with respect to the value of the $V_{GS}$ thereof. For example, if the gate length lg = 1 μm, gate width wg = 400 μm, and the threshold voltage Vth = 0.4 V, the impedance may vary between 250 Ω to 20 Ω with respect to the $V_{GS}$ range −0.4 V to 0 V. As a result, the impedance of the second FET Tr12, serving as a drain load, can be changed by controlling the voltage applied to the gate line g13 of the third FET Tr13, and thus, the gain of the FET Tr12 serving as an amplifier can be controlled.

Figure 20:
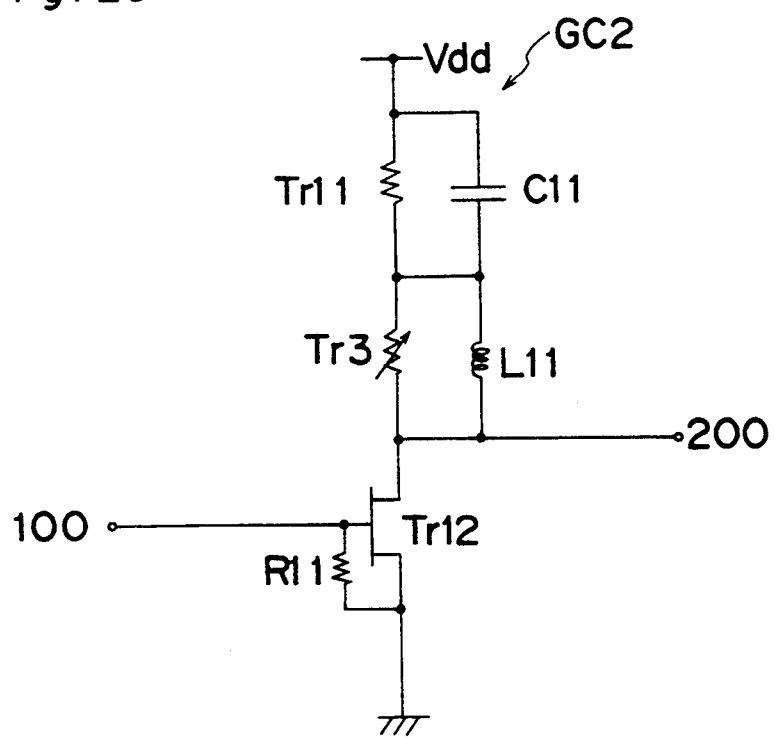
FIG. 20 is an equivalent circuit diagram of the gain control circuit shown in FIG. 2.

As described above, the impedance of the first FET Tr11, which serves an active load, is high, approximately 700. Ω. In other words, the load connected to the drain of the second FET Tr12, i.e., the amplifier, is high, and sufficient gain can therefore be obtained. When this load is substituted by a resistance load, a voltage drop of 7 V occurs when $I_{DSS}$ is 10 mA, but by using the first FET Tr11 as an active load, the potential difference can be limited to approximately 2.5 V. Variations in the DC bias can thus be prevented. In FIG. 20, an equivalent circuit of the gain control circuit GC2 with respect to AC signal is shown.

Figure 9:
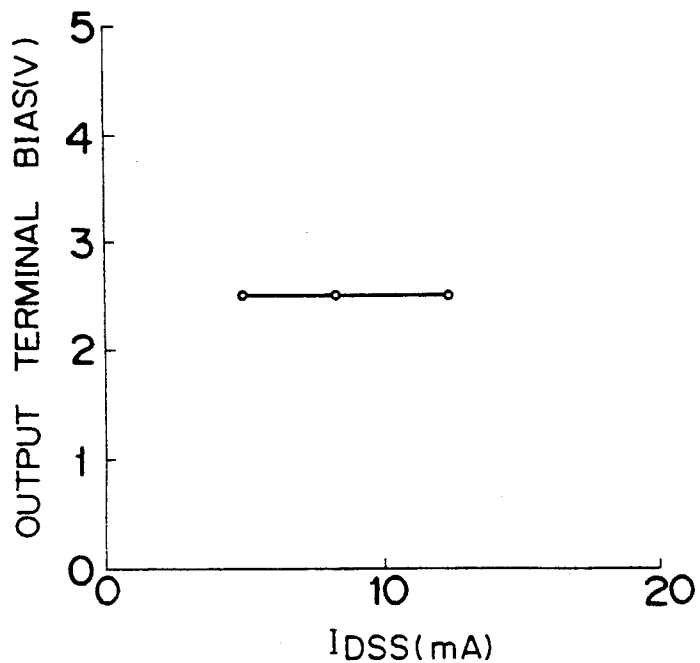
FIG. 9 is a graph of the maximum saturation drain current dependency of the output terminal bias in the gain control circuit shown in FIG. 2.
Figure 10:
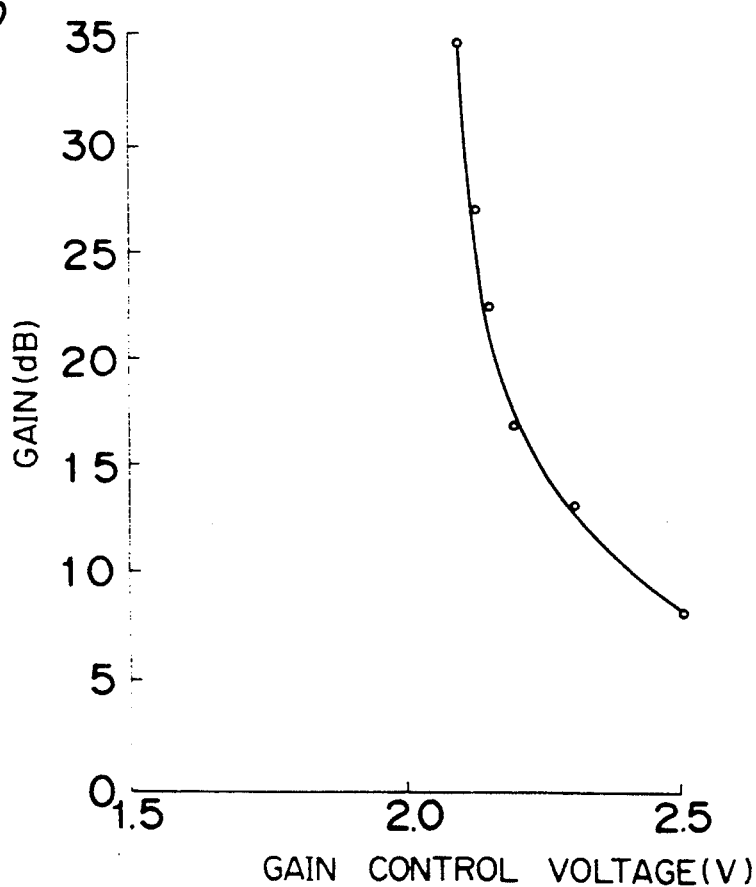
FIG. 10 is a graph of the gain control voltage dependency of the gain in the gain control circuit shown in FIG. 2.

Referring to FIGS. 9 and 10, the maximum saturation drain current dependency of the output terminal bias and the gain control voltage dependency of the gain in the gain control circuit GC2 are described below. The characteristics represented in these figures are obtained from the experiments. The experiments are executed under the conditions that the $V_{dd}$ is 5 V, the voltage applied to the gain control terminal 300, i.e., the gain control voltage, ranges from 2.0–2.5 V, the gate width wg of each of the first, second, and third FETs Tr11, Tr12, and Tr13 is 250 μm, the bias-setting damping resistance R11 is 1 kΩ, the high frequency ground capacitor C11 is 1000 Pf, the choke coil L11 inductance is 1 μH, and the used frequency is 100 MHz.

As shown in FIG. 9, a stable bias level is at 2.5 V throughout the maximum saturation drain current $I_{DSS}$ from 5.1 to 13.0 mA, provided that the gain control voltage is 2.5 V.

As shown in FIG. 10 with the circuit GC2 of FIG. 2, it is possible to control the gain from +35 dB to +8 dB with respect to the gain control voltage from 2.0 V to 2.5 V. In other words, the variation form the voltage range for obtaining the maximum gain to the voltage for obtaining the minimum gain is between the power supply voltage and the ground voltage of the gain control circuit. Thus, it is not necessary to provide a separate power supply for controlling the gain. It is to be noted that the maximum saturation drain current $I_{DSS}$ obtained in the above case is 8.7 mA.

It is to be noted that the high frequency ground capacitor C11 is connected between the power supply and the source line of the first FET Tr11 in the second embodiment described above, but the same effect can be obtained by connecting it between the ground and the source line of the first FET Tr11.

Figure 3:
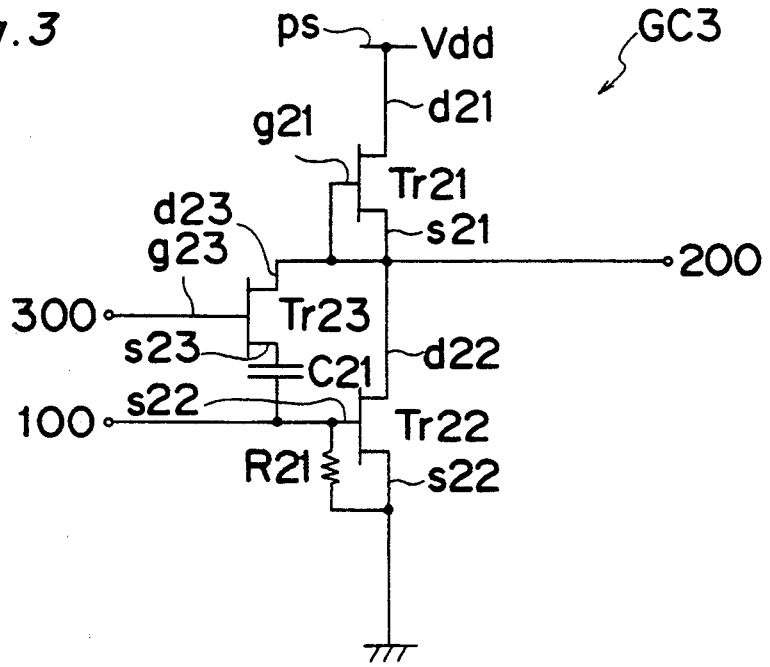
FIG. 3 is a circuit diagram of a gain control circuit according to a third embodiment of the invention.

Referring to FIG. 3, a gain control circuit according to a third embodiment of the present invention is described. The gain control circuit GC3 comprises three FETs. The first FET Tr21 is used as an active load, the second FET Tr22 is used as an amplifier, and the third FET Tr23 as a variable active load. The first and second FETs, Tr21 and Tr22 have substantially the same characteristics.

The gain control circuit further comprises a bias-setting damping resistor R21, a coupling capacitor C21, an input terminal 100, an output terminal 200, a gain control terminal 300, and a power supply line ps. A drain line d21 of the first FET Tr21 is connected to the power supply line ps, and a source line s21 and a gate line g21 are connected to a drain line d22 of the second FET Tr22. The bias-setting damping resistor R21 is connected between a gate line g22 of the second FET Tr22 and the ground, and a source line s22 of the second FET Tr22 is grounded. A drain line d23 of the third FET Tr23 is connected to the drain line d22 of the second FET Tr22. The coupling capacitor C21 is connected to a source line s23 of the third FET Tr23 and the gate line g22 of the second FET Tr22.

The gate line g22 and drain lines d22 of the second FET Tr22 are connected to the input terminal 100 and output terminal 200, respectively, and a gate line g23 of the third FET Tr23 is connected to the gain control terminal 300. The gain of the second FET Tr22, which serves an amplifier, is changed by varying the voltage applied to the gain control terminal 300.

First, the operation of the gain control circuit GC3 with respect to the DC bias is described below. The resistance of the bias-setting damping resistor R21 is set so that the voltage drop caused by the gate leakage current of the second FET Tr22 at the bias-setting damping resistor R21 is sufficiently low. The $I_{DSS}$ of the second FET Tr22 through the line d22 is set to approximately one hundred times the current flowing through the line g23. As a result, the circuit is self-biased such that the same $I_{DSS}$ of the second FET Tr22 flows to the first FETs Tr21. Also, the drain-source voltage $V_{DS}$ is equal in the first and second FETs Tr21 and Tr22, and the gate-source voltage $V_{GS}$ is also equal in these two FETs. As a result, the voltage of the output terminal 200 is one-half (½) of the $V_{dd}$ regardless of the value of $I_{DSS}$.

Next, the operation of the gain control circuit GC3 with respect to the RF characteristics is described below. The total feedback impedance Zt between the drain line d22 and gate lines g22 of the second FET Tr22, which serves as a source-grounded amplifier, is determined by the impedance 223 between the drain line d23 and source line s23 of the third FET Tr23 and the impedance Zc of the coupling capacitor C21, and is obtained as follows:

$$Zt = Z23 + Zc.$$

Zt is mostly controlled by the impedance Z23, because the impedance Zc is low, e.g., 10 Ω when the capacitance to a 1 Ghz signal is 100 Pf.

The third FET Tr23 source input impedance is the impedance when $V_{DS}$ is 0 V, but varies with the value of the gate-source voltage $V_{GS}$. For example, if the gate length lg=1 μm, gate width wg=400 μm, and the threshold voltage Vth=0.4 V, the impedance will vary between 250 Ω to 20 Ω through the $V_{GS}$ range −0.4 V to 0 V. As a result, the feedback from the drain line d22 to the gate line g22 of the second FET Tr22 can be changed and the gain can be controlled by controlling the third FET Tr23 gate voltage.

Figure 21:
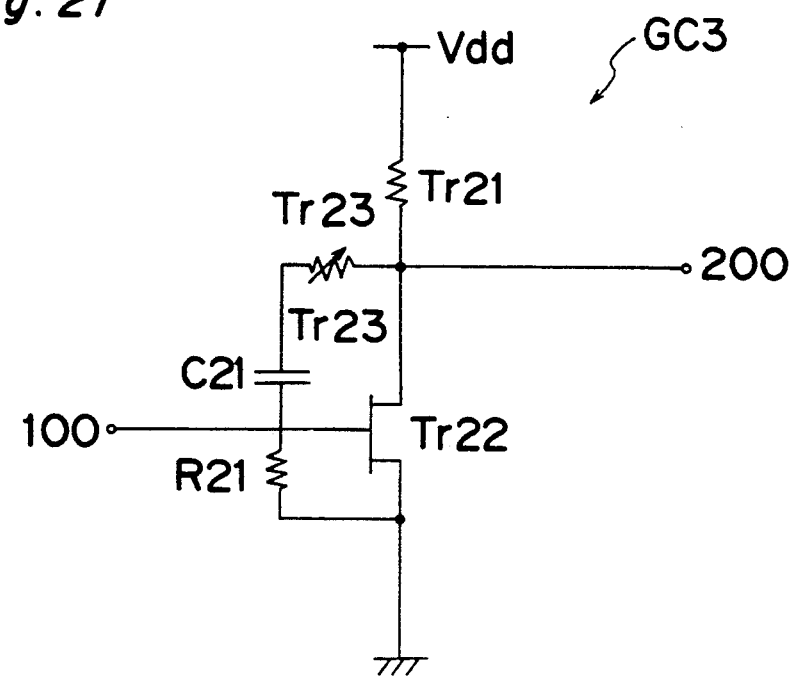
FIG. 21 is an equivalent circuit diagram of the gain control circuit shown in FIG. 3.

The impedance of the first FET Tr21, which serves an active load, is high (approximately 700 Ω) because the same signal is input to both the source and gate lines s21 and g21. In other words, the load connected to the drain of the second FET Tr22, i.e., the amplifier, is high, and sufficient gain can therefore be obtained. When this load is substituted by a resistance load, a voltage drop of 7 V occurs when $I_{DSS}$ is 10 mA, but by using the first FET Tr21 as an active load, the potential difference can be limited to approximately 2.5 V. Variations in the DC bias can thus be prevented. In FIG. 21, an equivalent circuit of the gain control circuit GC3 with respect to AC signal is shown.

Figure 11:
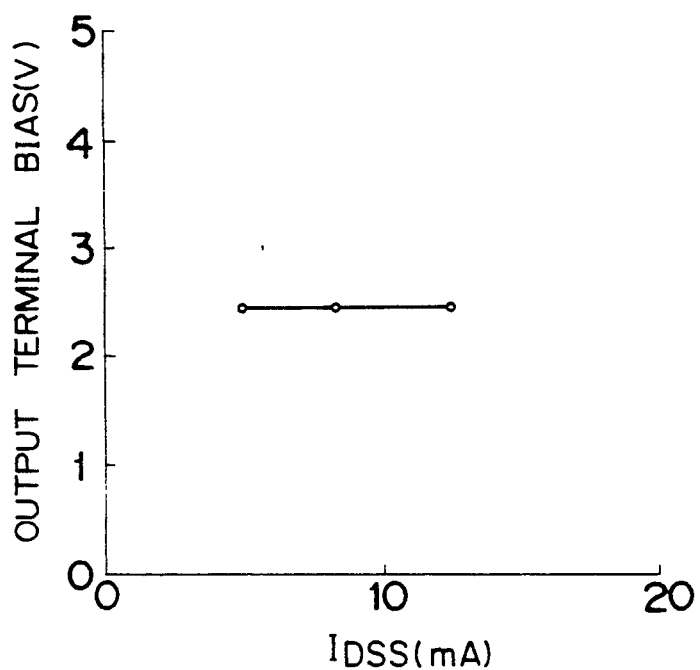
FIG. 11 is a graph of the maximum saturation drain current dependency of the output terminal bias in the gain control circuit shown in FIG. 3.
Figure 12:
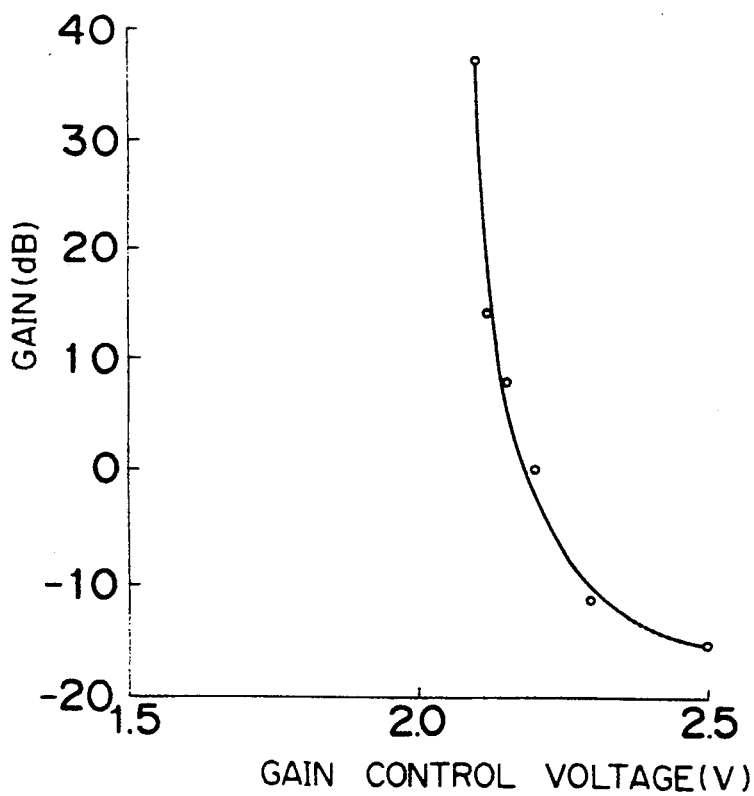
FIG. 12 is a graph of the gain control voltage dependency of the gain in the gain control circuit shown in FIG. 3.

Referring to FIGS. 11 and 12, the maximum saturation drain current dependency of the output terminal bias and the gain control voltage dependency of the gain in the gain control circuit GC3 are described below. The characteristics represented in these figures are obtained from the experiments. The experiments are executed under the conditions that the $V_{dd}$ is 5 V, the voltage applied to the gain control terminal 300, i.e., the gain control voltage, is from 2.0-2.5 V, the gate width wg of each of the first, second, and third FETs Tr21, Tr22, and Tr23 is 250 μm, the bias-setting damping resistance R21 is 1 kΩ, the coupling capacitor C21 is 1000 Pf, and the used frequency is 100 MHz.

As shown in FIG. 11, a stable bias level at 2.5 V throughout the $I_{DSS}$ from 5.1 to 13.0 mA, provided that the gain control voltage is 2.5 V.

As shown in FIG. 12, with the circuit GC3 of FIG. 3, it is possible to control the gain from +37 dB to −15 dB with respect to the gain control voltage from 2.0 V to 2.5 V. In other words, the variation from the voltage for obtaining the maximum gain to the voltage for obtaining the minimum gain is between the power supply voltage and the ground voltage of the gain control circuit GC3. Thus, it is not necessary to provide a separate power supply for controlling the gain. It is to be noted that the $I_{DSS}$ obtained in the above case is 8.7 mA.

Figure 4:
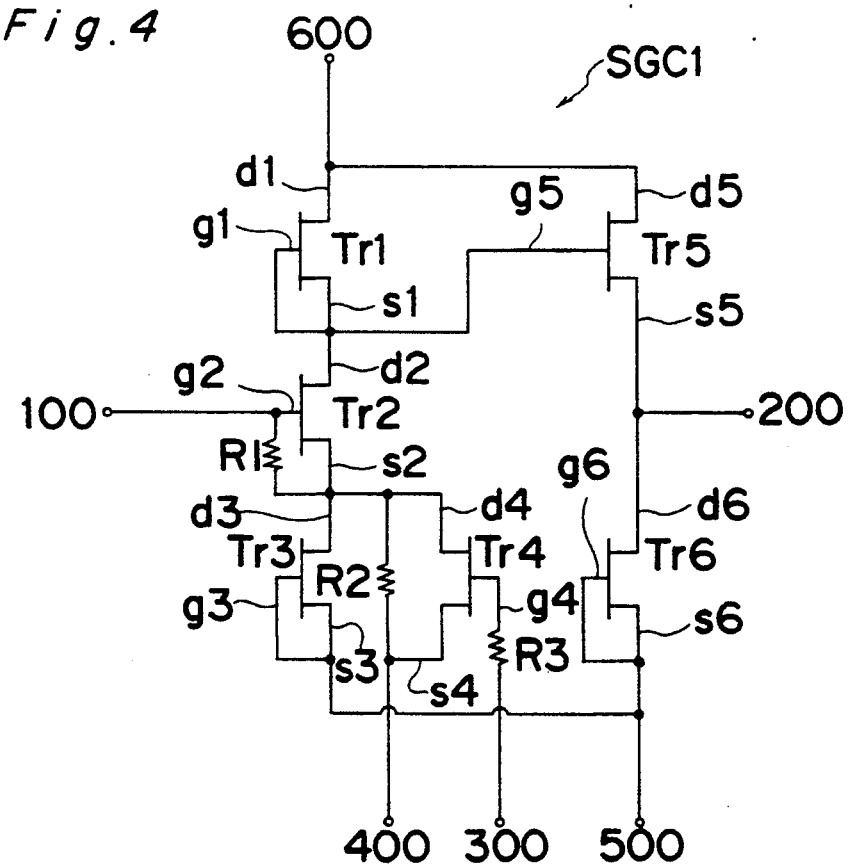
FIG. 4 is a circuit diagram of a first semiconductor device according to the first embodiment of the present invention.

Referring to FIG. 4, a circuit diagram of a semiconductor device based on the gain control circuit GC1 according to the first embodiment shown in FIG. 1 is shown. The semiconductor device SGC1 is an integrated circuit device in which the major part of the gain control circuit GC1 of the present invention is assembled. In addition to the circuit shown in FIG. 1, the semiconductor device SGC1 shown in FIG. 4 has a fifth FET Tr5 as a source follower, a sixth FET Tr6 as a rated current source, a gain clamp resistor R2, and a current clamp resistor R3. The power supply line ps and the ground terminal are substituted by a power supply terminal 600 and a ground terminal 500, respectively. It is to be noted that the high frequency ground capacitor C1 is externally provided between a high frequency ground terminal 400 and any one of the ground terminal 500, the power supply terminal 600, or other high frequency ground point.

The fifth FET Tr5 has a drain line d5 connected to the drain line d1 of the first FET Tr1, a gate line g5 connected to the gate line g1 and the source line s1 of the first FET Tr1, and a source line s5 connected to the output terminal 200, as shown. The sixth FET Tr6 has a drain line d6 connected to the output terminal 200, and has a gate line g6 and a source line s6 which are connected to the ground terminal 500. Thus, the fifth FET Tr5 and sixth FET Tr6 function as a source follower and a rated current source, respectively.

The gain clamp resistor R2 is connected between the drain line d4 and the source line s4 of the fourth FET Tr4. The current clamp resistor R3 is connected between the gate line g4 of the fourth FET Tr4 and the gain control terminal 300.

The semiconductor device SGC1, when compared with the gain control circuit GC1 described with respect to FIG. 1, has the high capacitance capacitor C1 externally connected because it is difficult to assemble the capacitor in the integrated circuit. Also, the source follower FET Tr5 is added as an output buffer, and both gain clamp resistor R2 and current clamp resistor R3 are added. Therefore, as with the gain control circuit GC1, the first, second, and third FETs Tr1, Tr2, and Tr3 are self-biased to the same characteristics as described above. The voltage of the output terminal 200 is therefore fixed to two-thirds ($\frac{2}{3}$) of the $V_{dd}$ regardless of the $I_{DSS}$, and the source voltage of the second FET Tr2 is fixed at one-third ($\frac{1}{3}$) of the $V_{dd}$. The impedance of the third FET Tr3 bypass can be changed. Thus, the gain can be controlled by controlling the gate voltage of the fourth FET Tr4.

The change in the bias level of the output terminal 200 is described. The gate-source voltage $V_{GS}$ results from the maximum saturation drain current $I_{DSS}$ because the fifth FET Tr5 is driven by the $I_{DSS}$ of the sixth FET Tr6. The value of this voltage depends upon the change in the sixth FET Tr6 $I_{DSS}$, but the change in $I_{DS}$ to the variation in the $V_{GS}$ is small. For example, if the gate length lg=1 μm, gate width wg=500 μm, the threshold voltage Vth=0.4 V, and the conductance gm is 100 mS, the $V_{GS}$ will change only 0.1 V even if there is a 10 mA change in the sixth FET Tr6 $I_{DSS}$. This is an extremely stable bias level considering the operation of the fifth and sixth FETs Tr5, Tr6 at the saturation range, and is possible because the fifth FET Tr5 gate voltage is fixed at two-thirds of the $V_{dd}$.

Figure 22:
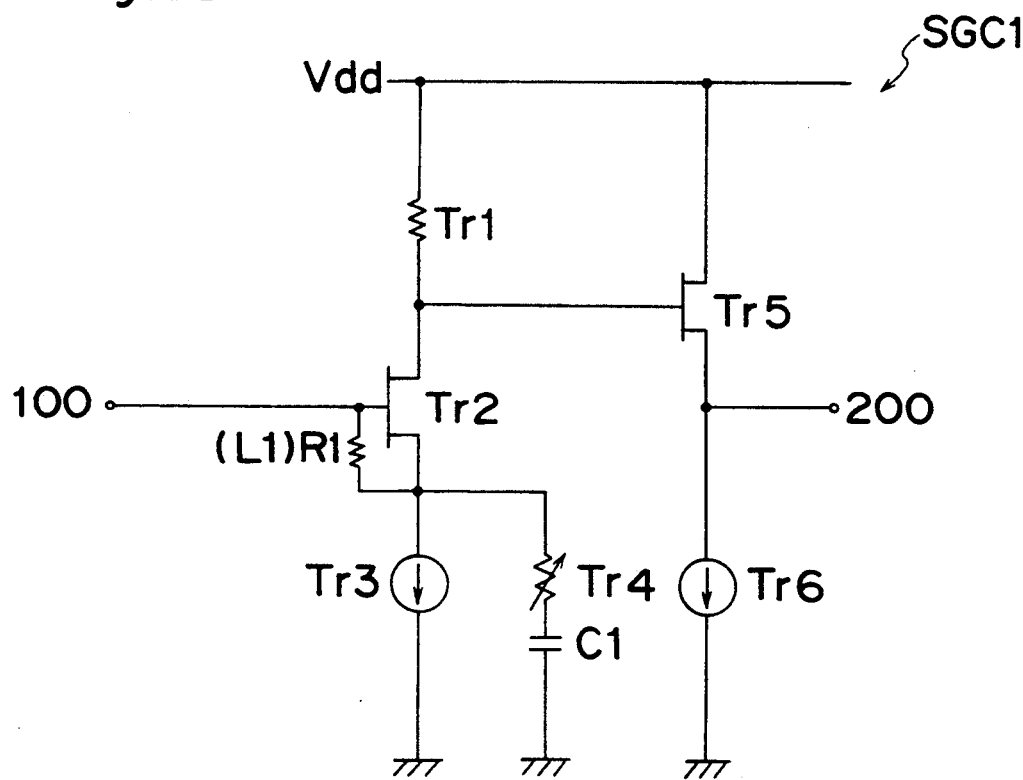
FIG. 22 is an equivalent circuit diagram of the semiconductor device shown in FIG. 4.

In addition, the gain clamp resistor R2 is used to prevent deterioration of the third order intermodulation distortion characteristics caused by the bypass impedance being too high. The current clamp resistor R3 provides both a direct current control function and a high frequency characteristic control function. With respect to direct current, when the voltage difference between the gain control terminal 300 and the source line s2 of the second FET Tr2 becomes greater than the Schottky barrier, there is a large current flow from the fourth FET Tr4 gate to the third FET Tr3. To prevent this, the current clamp resistor R3 drops the voltage and lowers the gate potential of the fourth FET Tr4. With respect to high frequency characteristics, the current clamp resistor R3 inhibits signal leaking through the draingate capacity of the fourth FET Tr4 to the gain control terminal 300. As a result, by inserting the current clamp resistor R3 between the fourth FET Tr4 gate line and the gain control terminal 300, fluctuations in the DC bias can be easily prevented, gate damage caused by forward current can be avoided, and the high frequency characteristics can be improved. In addition, a stable power supply to the load can be maintained because the fifth FET Tr5 is a source follower that reduces the output impedance across a wide band width. In FIG. 22, an equivalent circuit of the semiconductor device SGC1 is shown. It is to be noted that the fifth and sixth FETS Tr5 and Tr6 are functioning as an impedance matching.

Figure 13:
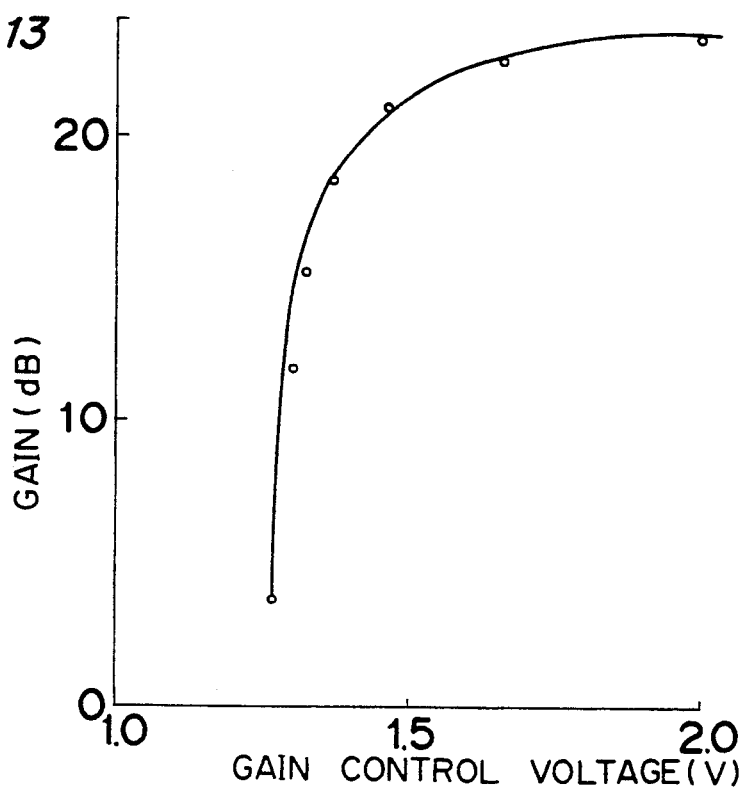
FIG. 13 is a graph of the gain control voltage dependency of the gain in the first semiconductor device shown in FIG. 4.
Figure 14:
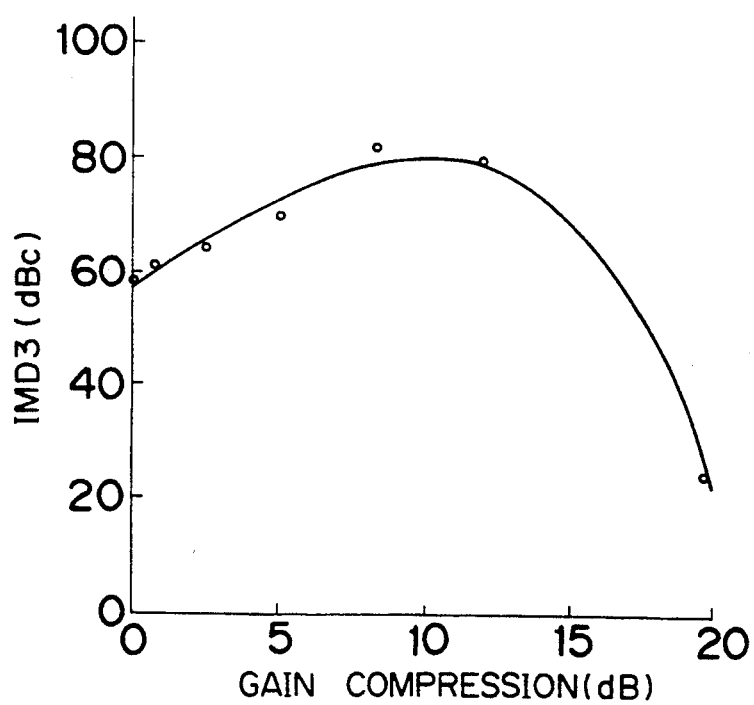
FIG. 14 is a graph of the gain compression dependency of the third order intermodulation distortion suppression ratio in the first semiconductor device shown in FIG. 4.

Referring to FIGS. 13 and 14, the gain control voltage dependency of the gain and the gain compression dependency of the third order intermodulation distortion product suppression ratio (herein after referred to as "IMD3") in the semiconductor device SGC1 are described. It is to be noted that the third order intermodulation distortion product is a byproduct signal when the two different signals are input to the circuit. IMD3 represents how this byproduct signal is suppressed. The characteristics represented in these figures are obtained from the experiments executed under the conditions that the power supply voltage is 5 V, the gain control voltage applied to the gain control terminal 300 is varied from 1.2 to 2.0 V, the gate width wg of each of the first, second, third, and fifth FETs Tr1, Tr2, Tr3, Tr5 is 250 μm, the gate width wg of the fourth FET Tr4 is 400 μm, the gate width wg of the sixth FET Tr6 is 500 μm, the bias setting damping resistor R1 is 1 kΩ, the gain clamp resistor R2 is 1 kΩ, the current clamp resistance R3 is 10 kΩ, and the 1000 pF high frequency ground capacitor is connected between the high frequency ground terminal 400 and the ground terminal 500.

As shown in FIG. 13, with the semiconductor device SGC1 of FIG. 4, it is possible to control the gain from +24 dB to +4 dB with respect to the gain control voltage from 1.0 V to 1.6 V. In other words, the variation from the voltage for obtaining the maximum gain to the voltage for obtaining the minimum gain is between the power supply voltage and the ground voltage of the semiconductor device SGC1. Thus, it is not necessary to provide a separate power supply for controlling the gain. It is to be noted that the measured frequency is 400 MHz, and the maximum saturation drain current $I_{DSS}$ obtained in the above case is 8.3 mA.

The gain compression dependency of the IMD3 is shown in FIG. 14, in which the third order intermodulation distortion product of 350 MHz when two signals (400 MHz and 450 MHz) are input at a −30 dBm input level is employed. The output component when a 400 MHz signal is input at a −30 dBm input level is employed as a signal component. As shown in FIG. 14, third order intermodulation distortion product performance of greater than 60 dBc is obtained within a range from zero to 15 dB of gain compression.

Figure 5:
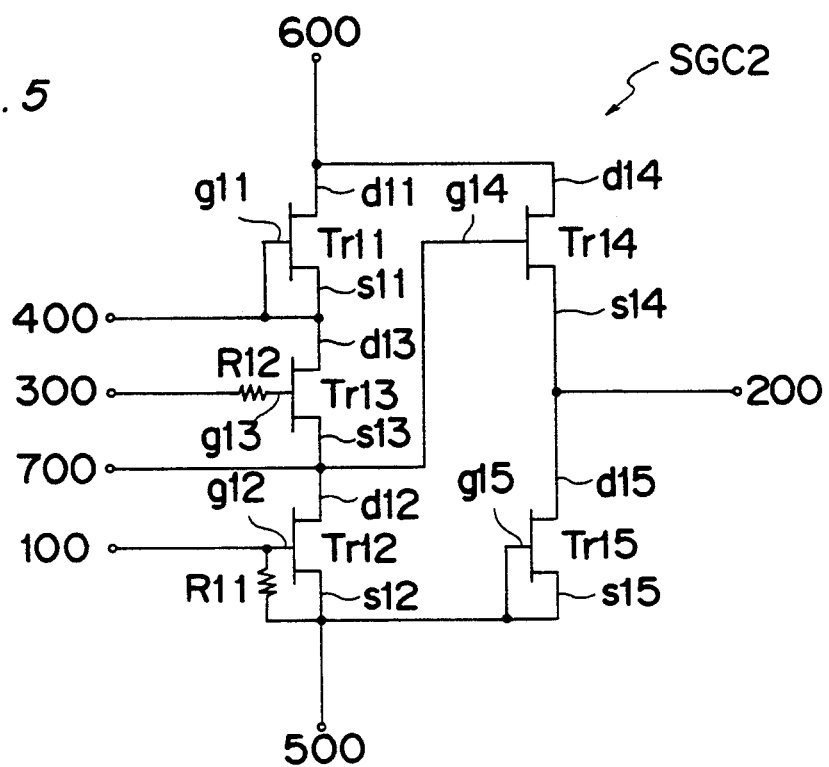
FIG. 5 is a circuit diagram of a second semiconductor device according to the second embodiment of the present invention.

Referring to FIG. 5, a circuit diagram of semiconductor device based on the gain control circuit GC2 according to the second embodiment shown in FIG. 2 is shown. The semiconductor device SGC2 is an integrated circuit device in which the major part of the gain control circuit CG2 of the present invention is assembled. In addition to the circuit shown in FIG. 2, the semiconductor device SGC2 shown in FIG. 5 has a fourth FET Tr14 as a source follower, a fifth FET Tr6 as a rated current source, and a current clamp resistance R12. The power supply line ps and the ground terminal are substituted by a power supply terminal 600 and a ground terminal 500, respectively. It is to be noted that the choke coil L11 and high capacity high frequency ground capacitor C11 is externally provided between a high frequency ground terminal 400 and any one of the ground terminal 500, the power supply terminal 600, or other high frequency ground point. A choke coil (not shown) is also connected externally to the high frequency ground terminal 400 and a choke coil terminal 700.

The fourth FET Tr14 has a drain line d14 connected to the drain line d11 of the first FET Tr11, a gate line g14 connected to the source line s13 of the third FET Tr13, and a source line s14 connected to the output terminal 200, as shown. The fifth FET Tr5 has a drain line d15 connected to the source line s14 of the fourth FET Tr14, and has a gate line g15 and a source line s15 which are connected to the ground terminal 500. Thus, the fourth FET Tr14 and the fifth FET Tr15 function as a source follower and a rated current source, respectively.

The current clamp resistance R12 is connected between the gate line g13 of the third FET Tr13 and the gain control terminal 300.

The semiconductor device SGC2, when compared with the gain control circuit GC2 described with respect to FIG. 2, has the choke coil L11 and high capacity high frequency ground capacitor C11, because it is difficult to assemble the coil and capacitor in the integrated circuit. Also, the source follower FET Tr14 is added as an output buffer, and a current clamp resistance R12 are added. Therefore, as with the gain control circuit according to the second embodiment of the invention, the first and second FETs Tr11, Tr12 are self-biased to the same characteristics as described above. The voltage of the output terminal 200 is therefore fixed to one-half (½) of the $V_{dd}$ regardless of the $I_{DSS}$. The load impedance of the second FET Tr12 can therefore be changed. Thus, the gain can be controlled by controlling the gate voltage of the third FET Tr13.

The change in the bias level of the output terminal 200 is described next. The gate-source voltage $V_{GS}$ results from the maximum saturation drain current $I_{DSS}$ because the fourth FET Tr14 is driven by the $I_{DSS}$ of the fifth FET Tr15. The value of this voltage depends upon the change in the fifth FET Tr15 $I_{DSS}$, but the change in $I_{DS}$ to the variation in the $V_{GS}$ is small. For example, if the gate length lg=1 μm, gate width wg=500 μm, the threshold voltage Vth=0.4 V, and the conductance gm is 100 mS, the $V_{GS}$ will change only 0.1 even if there is a 10 mA change in the fifth FET Tr15 $I_{DSS}$. This is an extremely stable bias level considering the operation of the fourth and fifth FETs Tr14, Tr15 at the saturation range, and is possible because the fourth FET Tr14 gate voltage is fixed at one-half of the $V_{dd}$.

The current clamp resistance R12 provides both a direct current control functin and a high frequency characteristic control function. With respect to direct current, when the voltage difference between the gain control terminal 300 and the source line of the first FET Tr11 becomes greater than the Schottky barrier, there is a large current flow from the third FET Tr13 gate to the second FET Tr12. To prevent this, the current clamp resistance R12 drops the voltage and lowers the gate potential of the third FET Tr13. With respect to high frequency characteristics, the current clamp resistance R12 inhibits signal leaking through the source-gate capacity of the third FET Tr13 to the gain control terminal 300. As a result, by inserting the current clamp resistance R12 between the third FET Tr13 gate line and the gain control terminal 300, fluctuations in the DC bias can be easily prevented, gate damage caused by forward current can be avoided, and the high frequency characteristics can be improved. In addition, a stable power supply to the load can be maintained because the fourth FET Tr14 is a source follower that reduces the output impedance across a wide band width.

Figure 23:
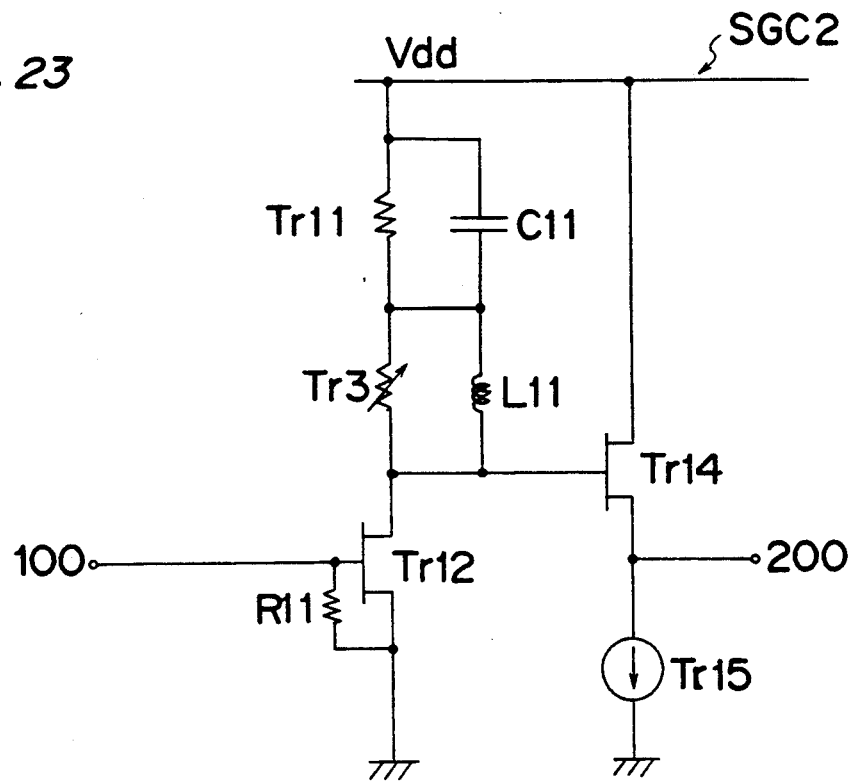
FIG. 23 is an equivalent circuit diagram of the semiconductor device shown in FIG. 5.
Figure 24:
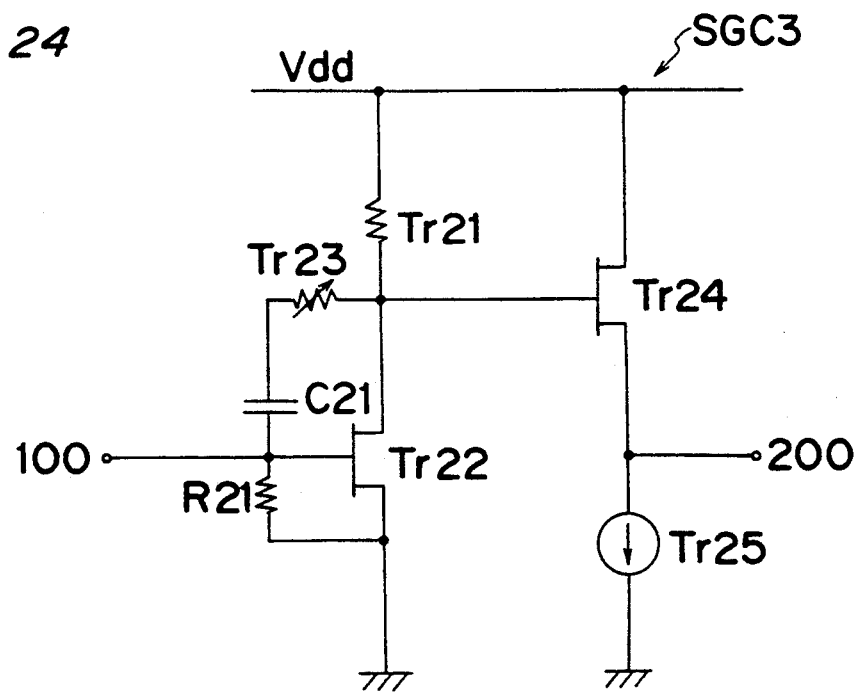
FIG. 24 is an equivalent circuit diagram of the semiconductor device shown in FIG. 6.

A gain clamp resistance (not shown in the figures) can also be inserted parallel to the choke coil between the high frequency ground terminal 400 and the choke coil terminal 700 to prevent deterioration of the third order intermodulation distortion characteristics caused by the load impedance becoming too high. In FIG. 23, an equivalent circuit of the semiconductor device SGC2 is described. The fourth and fifth FETS Tr4 and Tr5 are functioning as an impedance matching.

Figure 15:
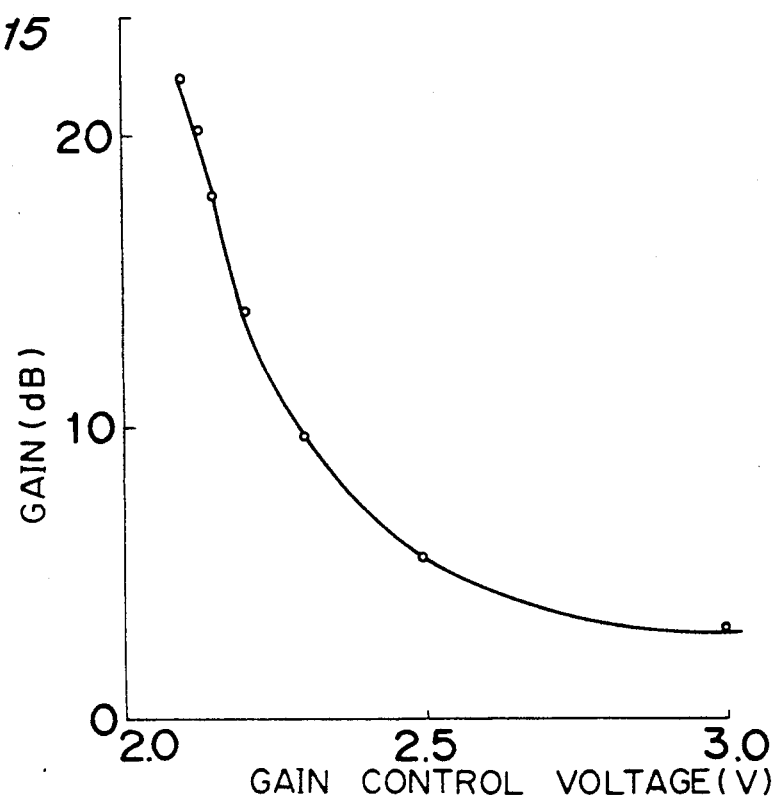
FIG. 15 is a graph of the gain control voltage dependency of the gain in the second semiconductor device shown in FIG. 5.
Figure 16:
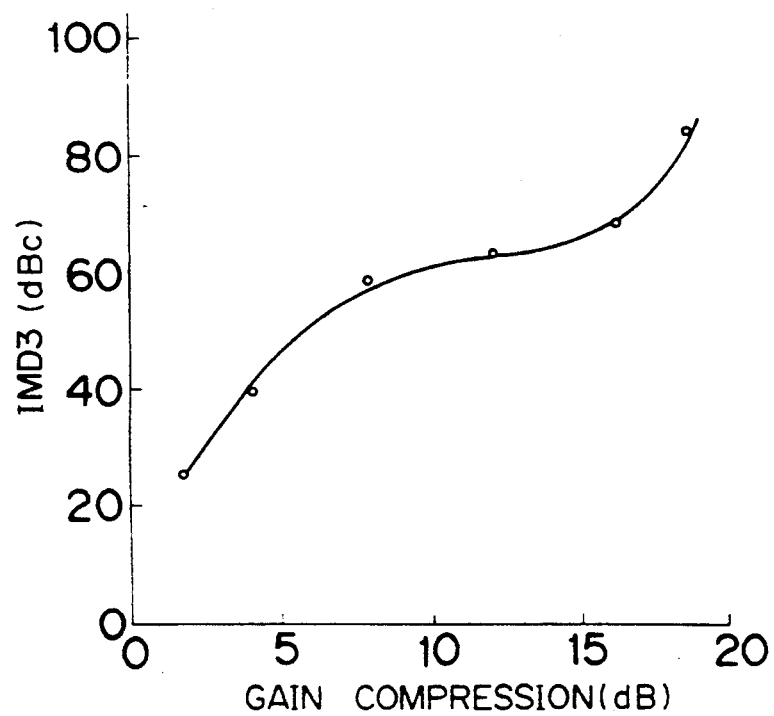
FIG. 16 is a graph of the gain compression dependency of the third order intermodulation distortion suppression ratio in the second semiconductor device shown in FIG. 5.

Referring to FIGS. 15 and 16, the gain control voltage dependency of the gain and the gain compression dependency of the IMD3 in the semiconductor device SGC2 according are described below. The characteristics represented in these figures are obtained from the experiments executed under the conditions that the power supply voltage is 5 V, the voltage applied to the gain control terminal 300, i.e., the gain control voltage, ranges from 2.0 to 2.5 V, the gate width wg of each of the first, second, and third FETs Tr11, Tr12, Tr13 is 250 μm, the gate width wg of the fourth and fifth FETs Tr14, Tr15 is 500 μm, the bias setting damping resistance R11 is 10 kΩ, the external high frequency ground capacitor is 1000 Pf, and the 1 μH inductance choke coil is connected between the high frequency ground terminal 400 and the choke coil terminal 700. A 1 kΩ gain clamp resistance (not shown) is also connected between the high frequency ground terminal 400 and the choke coil terminal 700.

As shown in FIG. 15, with the semiconductor device SGC2 of FIG. 5, it is possible to control the gain from +22 dB to +3 dB with respect to the gain control voltage from 2.0 V to 3.0 V. In other words, the variation from the voltage for obtaining the maximum gain to the voltage for obtaining the minimum gain is between the power supply voltage and the ground voltage of the gain control circuit. Thus, it is not necessary to provide a separate power supply for controlling the gain. It is to be noted that the measured frequency is 400 MHz, and the maximum saturation drain current $I_{DSS}$ obtained in the above case is 8.9 mA.

The gain compression dependency of the IMD3 is shown in FIG. 16. The third order intermodulation distortion product of the 350 MHz produced when two signals (400 MHz and 450 MHz) are input at a −30 dBm input level is employed. The output component when a 400 MHz signal is input at a −30 dBm input level is employed as the signal component. As will be known from FIG. 16, third order intermodulation distortion product performance of greater than 60 dBc is obtained with respect to a gain compression from zero to 10 dB.

Figure 6:
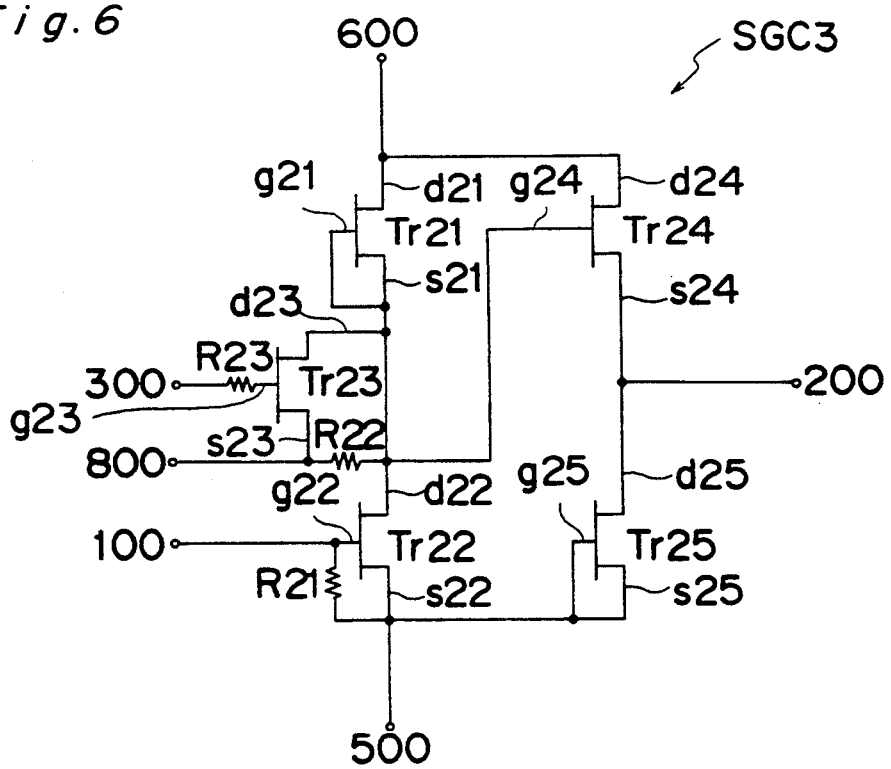
FIG. 6 is a circuit diagram of a third semiconductor device according to the third embodiment of the present invention.

Referring to FIG. 6, a circuit diagram of semiconductor device based on the gain control circuit GC3 according to the third embodiment shown in FIG. 3 is shown. The semiconductor device SGC3 is an integrated circuit device in which the major part of the gain control circuit GC3 is assembled. In addition to the circuit GC3 shown in FIG. 3, the semiconductor device SGC3 shown in FIG. 6 has a fourth FET Tr24 as a source follower, a fifth FET Tr25 as a rated current source, a gain clamp resistance R22, and a current clamp resistance R23. The power supply line ps and the ground line are substituted by a power supply terminal 600 and a ground terminal 500, respectively. It is to be noted that the coupling capacitor C21 is externally provided between a coupling capacitor terminal 800 and the input terminal 100.

The fourth FET Tr24 has a drain line d24 connected to the power supply terminal 600, a gate line g24 connected to the drain line d22 of the second FET Tr22, and a source line s24 connected to the drain line d25 of the fifth FET Tr25. The fifth FET Tr25 has a drain line d25 connected to the source line s24 of the fourth FET Tr24, and a gate line g25 and a source line s25 which are connected to the ground terminal 500, as shown.

The semiconductor device SGC3, when compared with the gain control circuit GC3 described with respect to FIG. 3, has the coupling capacitor externally connected because it is difficult to assemble the capacitor in the integrated circuit. Also, the source follower FET Tr24 is added as an output buffer, and a gain clamp resistance R22 and current clamp resistor R23 are added. Therefore, as with the gain control circuit according to the third embodiment of the invention, the first and second FETs Tr21, Tr22 are self-biased as described above so that the $V_{DS}$ is equal in both. The voltage of the output terminal 200 is therefore fixed to one-half ($\frac{1}{2}$) of the $V_{dd}$ regardless of the $I_{DSS}$. The feedback from the drain line to the gate line of the second FET Tr22 can therefore be changed. Thus, the gain can be controlled by controlling the gate voltage of the third FET Tr23.

The change in the bias level of the output terminal 200 is described. The $V_{GS}$ results from the $I_{DSS}$ because the fourth FET Tr24 is driven by the $I_{DSS}$ of the fifth FET Tr25. The value of this voltage depends upon the change in the fifth FET Tr25 $I_{DSS}$, but the change in $I_{DS}$ to the variation in the $V_{GS}$ is small. For example, if the gate length lg=1 $\mu$m, gate width wg=500 $\mu$m, the threshold voltage Vth=0.4 V, and the conductance gm is 100 mS, the $V_{GS}$ will change only 0.1 V even if there is a 10 mA change in the fifth FET Tr25 $I_{DSS}$. This is an extremely stable bias level considering the operation of the fourth and fifth FETs Tr24, Tr25 at the saturation range, and is possible because the fourth FET Tr24 gate voltage is fixed at one-half ($\frac{1}{2}$) of the $V_{dd}$.

The gain clamp resistor R22 is used to prevent deterioration of the third order intermodulation distortion characteristics resulting from the feedback from the drain to the gate line of the second FET Tr22 being too low.

The current clamp resistor R23 provides both a direct current control function and a high frequency characteristic control function. With respect to direct current, when the voltage difference between the gain control terminal 300 and the drain line of the third FET Tr23 becomes greater than the Schottky barrier, there is a large current flow from the third FET Tr23 gate to the second FET Tr22. To prevent this, the current clamp resistor R23 drops the voltage and lowers the gate potential of the third FET Tr23. With respect to high frequency characteristics, the current clamp resistor R23 inhibits signal leaking through the drain-gate and the drain source capacity of the third FET Tr23 to the gain control terminal 300. As a result, by inserting the current clamp resistor R23 between the third FET Tr23 gate line and the gain control terminal 300, fluctuations in the DC bias can be easily prevented, gate damage caused by forward current can be avoided, and the frequency characteristics can be improved. In addition, a stable power supply to the load can be maintained because the fourth FET Tr24 is a source follower that reduces the output impedance across a wide band width. In FIG. 23, an equivalent of the semiconductor device SGC3 is described. The fourth and fifth FETS Tr24 and Tr25 are functions as an impedance matching.

Figure 17:
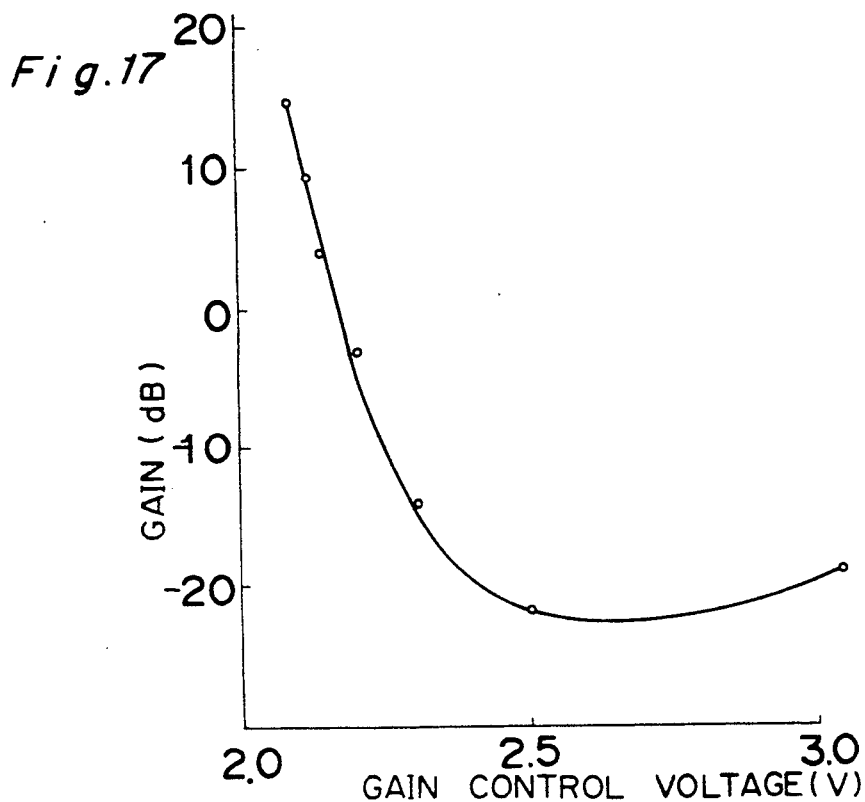
FIG. 17 is a graph of the gain control voltage dependency of the gain in the third semiconductor device shown in FIG. 6.
Figure 18:
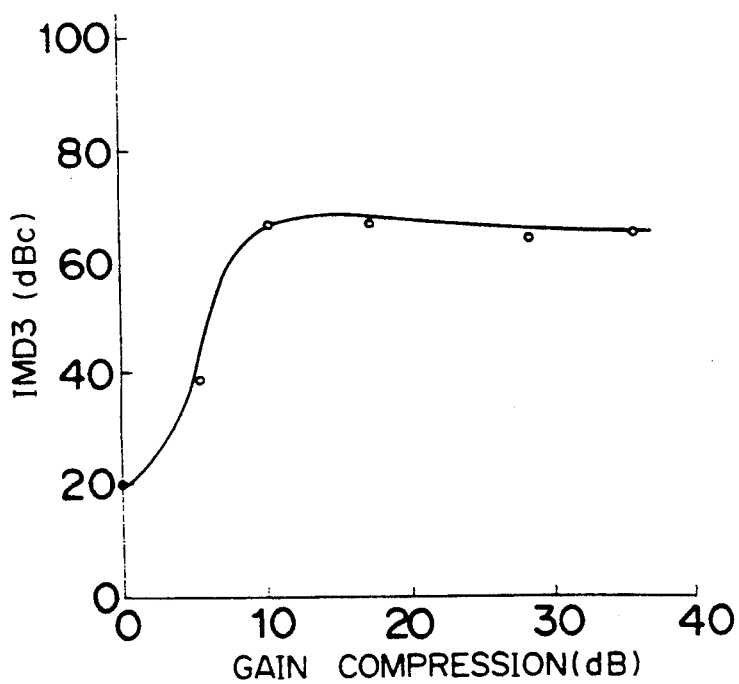
FIG. 18 is a graph of the gain compression dependency of the third order intermodulation distortion suppression ratio in the third semiconductor device shown in FIG. 6.

Referring to FIGS. 17 and 18, the gain control voltage dependency of the gain and the gain compression dependency of the IMD3 in the semiconductor device SGC3 described below. The characteristics represented in these figures are obtained from the experiments executed under the condition that the power supply voltage is 5 V, the gain control voltage applied to the gain control terminal 300 is varied from 2.0 to 3.0 V, the gate width wg of each of the first, second, and third FETs Tr21, Tr22, Tr23 is 250 $\mu$m, the gate width wg of the fourth and fifth FETs Tr24, Tr25 is 500 $\mu$m, the bias-setting damping resistor R21 and gain clamp resistor R22 are both 1 k$\Omega$, and the current clamp resistance R23 is 10 k$\Omega$. A 1000 pF coupling capacitor is connected between the coupling capacitor terminal 800 and the input terminal 100.

As shown in FIG. 17, with the semiconductor device SGC3 of FIG. 6, it is possible to control the gain from +14 dB to −22 dB with respect to the gain control voltage from 2.0 V to 3.0 V. In other words, the variation from the voltage for obtaining the maximum gain to the voltage for obtaining the minimum gain is between the power supply voltage and the ground voltage of the gain control circuit. Thus, it is not necessary to provide a separate power supply for controlling the gain control. It is to be noted that the measured frequency is 400 MHz, and the maximum saturation drain current $I_{DSS}$ obtained in the above case is 8.9 mA.

The gain compression dependency of the third order intermodulation distortion suppression ratio is shown in FIG. 18. The third order intermodulation distortion component is the 350 MHz third order intermodulation distortion output component produced when two signals (400 MHz and 450 MHz) are input at a −30 dBm input level. The signal component is the output component when a 400 MHz signal is input at a −30 dBm input level. As will be known from FIG. 18, third order intermodulation distortion product performance of greater than 60 dBc is obtained within a range from zero to 10 dB of gain compression.

As described hereinabove, a gain control circuit and a semiconductor device according to the present invention can set a sufficient drain to source voltage to operate each of the FETs in the saturation range, feature low third order intermodulation distortion product characteristics, and can simultaneously obtain both sufficient gain and a stable DC bias even when there is significant variation in the maximum saturation drain current and the power supply voltage is low. It is also not necessary to provide a separate power supply for gain control because the voltage range required to obtain the maximum and minimum gain levels is between the ground voltage and the power supply voltage of the gain control circuit.

In addition, the semiconductor device integrating this gain control circuit has few external terminals and requires few external components, and can therefore contribute to improved efficiency in the assembly process.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A gain control circuit comprising:
a first FET for serving as an active load connected to a power supply line;
a second FET for serving as an amplifier arranged in a series connection with said first FET;
a third FET for serving as a current source arranged in a series connection with said second FET;
a fourth FET for serving as a variable active load arranged in a parallel connection with said third FET, said fourth FET being connected to a gain control line; and
a capacitor connected between said third and fourth FETs, whereby the gain of said second FET is controlled by the voltage applied to the gate of said fourth gate through said gain control line.

2. A gain control circuit comprising:
a first FET having a first gate a first drain connected to a power line, and a first source connected to said first gate, said first FET serving as an active load;
a second FET having a second gate, a second drain connected to said first source, and a second source, said second FET serving as an amplifier;
a resistor connected between said second gate and said second source, said resistor serving as a damping resistor for setting the bias;
a third FET having a third gate, a third drain connected to said second source, a third source connected to said third gate, said third source and said third gate being grounded, said third FET serving as a current source, said first, second, and third FETs having substantially the same characteristics;
a fourth FET having a fourth gate connected to a gain control line, a fourth drain connected to said second source, and a fourth source, said fourth FET serving as a variable active load; and
a capacitor connected between said third source and said fourth source, whereby the gain of said second FET serving as an amplifier is controlled by the voltage applied to said fourth gate through said gain control line.

3. A gain control circuit comprising:
a first FET having a first gate, a first drain connected to a power line, and a first source connected to said first gate, said first FET serving as an active load;
a second FET having a second gate connected to a gain control line, a second drain connected to said first source, and a second source, said second FET serving as a variable active load;
a third FET having a third gate, a third drain connected to said second source, and a second source connected to a ground, said third FET serving as an amplifier, said first, second, and third FETs having substantially the same characteristics;
a capacitor connected between said first drain and said first source, said capacitor serving as a high frequency ground capacitor;
a choke coil connected between said second drain and said second source; and
a resistor connected between said third gate and said third source, said resistor serving as a damping resistor for setting the bias, whereby the gain of said third FET serving as an amplifier is controlled by the voltage applied to said second gate through said gain control line.

4. A gain control circuit comprising:
a first FET having a first gate, a first drain connected to a power line, and a first source connected to said first gate, said first FET serving as an active load;
a second FET having a second gate connected to a gain control line, a second drain connected to said first source, and a second source, said second FET serving as a variable active load;
a third FET having a third gate, a third drain connected to said first source, and a third source connected to a ground, said third FET serving as an amplifier, said first and third FETs having substantially the same characteristics;
a capacitor connected between said second source and said third gate;
a resistor connected between said third gate and said third source, said resistor serving as a damping resistor for setting the bias, whereby the gain of said third FET serving as an amplifier is controlled by the voltage applied to said second gate through said gain control line.

5. A semiconductor device comprising:
a first FET having a first gate, a first drain connected to a power line, and a first source connected to said first gate, said first FET serving as an active load;
a second FET having a second gate, a second drain connected to said first source, and a second source, said second FET serving as an amplifier;
a first resistor connected between said second gate and said second source, said first resistor serving as a damping resistor for setting the bias;
a third FET having a third gate, a third drain connected to said second source, a third source connected to said third gate, said third source and said third gate being grounded, said third FET serving as an rated current source, said first, second, and third FETs having substantially the same characteristics;
a fourth FET having a fourth gate connected to a gain control line, a fourth drain connected to said second source, and a fourth source grounded through a capacitor, said fourth FET serving as a variable active load;
a second resistor connected between said fourth drain and said fourth source, said second resistor serving as a gain clamper;

a third resistor connected between said fourth gate and said gain control line, said third resistor serving as a current clamper;

a fifth FET having a fifth gate connected to said first source, a fifth drain connected to said first drain, and a fifth source, said fifth FET serving as a source follower; and a sixth FET having a sixth gate, a sixth drain connected to said fifth source, and a sixth source connected to said sixth gate, said sixth FET serving as a rated current source, whereby the gain of said second FET serving as an amplifier is controlled by the voltage applied to said fourth gate through said gain control line.

6. A semiconductor device comprising:

a first FET having a first gate, a first drain connected to a power line, and a first source connected to said first gate, said first FET serving as an active load;

a second FET having a second gate, a second drain connected to said first source, and a second source, said second FET serving as a variable active load;

a first resistor between said second gate and a gain control line, said gain control line connected to said first source through a capacitor and to said second source through a choke coil;

a third FET having a third gate, a third drain connected to said second source, and a third source connected to a ground, said third FET serving as an amplifier, said first, second, and third FETs having substantially the same characteristics;

a second resistor connected between said third gate and said third source, said second resistor serving as a damping resistor for setting the bias;

a fourth FET having a fourth gate connected to said second source, a fourth drain connected to said first drain, and a fourth source; and a fifth FET having a fifth gate connected to said third source, a fifth drain connected to said fourth source, and a fifth source connected to said fifth gate, whereby the gain of said third FET serving as an amplifier is controlled by the voltage applied to said second gate through said gain control line.

7. A semiconductor device comprising:

a first FET having a first gate, a first drain connected to a power line, and a first source connected to said first gate, said first FET serving as an active load;

a second FET having a second gate, a second drain connected to said first source, and a second source, said second FET serving as a variable active load;

a third FET having a third gate connected to said second source through an capacitor, a third drain connected to said first source, and a second source connected to a ground, said third FET serving as an amplifier, said first and third FETs having substantially the same characteristics;

a fourth FET having a fourth gate connected to said third drain, a fourth drain connected to said first drain, and a fourth source, said fourth FET serving as a source follower, a fifth FET having a fifth gate connected to said third source, a fifth drain connected to said fourth source, and a fifth source connected to said fifth gate, said fifth FET serving as a rated current source;

a first resistor connected between said third gate and said third source, said resistor serving as a damping resistor for setting the bias;

a second resistor connected between said second source and said fourth drain, said second resistor serving as a gain clamper; and a third resistor connected between said second gate and a gain control line, said third resistor serving as a current clamper, whereby the gain of said third FET serving as an amplifier is controlled by the voltage applied to said second gate through said gain control line.

* * * * *